United States Patent [19]

Davis

[11] Patent Number: 4,488,865
[45] Date of Patent: Dec. 18, 1984

[54] PULSING COMBUSTION

[75] Inventor: Robert E. Davis, Mountain Home, Ark.

[73] Assignee: Arkansas Patents, Inc., Mountain Home, Ark.

[21] Appl. No.: 403,769

[22] PCT Filed: Dec. 22, 1981

[86] PCT No.: PCT/US81/01727
§ 371 Date: May 26, 1982
§ 102(e) Date: May 26, 1982

[87] PCT Pub. No.: WO82/02278
PCT Pub. Date: Jul. 8, 1982

[51] Int. Cl.³ .............................................. F23C 11/04
[52] U.S. Cl. .......................................... 431/1; 122/24; 137/533.11
[58] Field of Search ............... 431/1; 122/17, 24; 123/188 A, 188 B; 137/533.11, 512.3, 533.17; 60/741, 39.78; 251/20, 82; 239/99, 571, 583

[56] References Cited

U.S. PATENT DOCUMENTS

| 944,811 | 12/1909 | Nageburn | 137/533.11 |
| 2,634,804 | 4/1953 | Erickson | 431/1 |
| 3,105,516 | 10/1963 | Werra et al. | 137/533.11 |
| 3,944,668 | 11/1976 | Leisner et al. | 431/1 X |

FOREIGN PATENT DOCUMENTS

| 1366565 | 6/1964 | France | 431/1 |
| 718621 | 2/1980 | U.S.S.R. | 431/1 |

Primary Examiner—Randall L. Green
Attorney, Agent, or Firm—Thomas W. Speckman

[57] ABSTRACT

A pulsing combustion device (10) is disclosed including a combustion chamber (15) with a poppet valve (20) mounted for reciprocation in the combustion chamber (15). A pressurized combustible mixture is supplied to the poppet valve (20) with the combustion gases ignited in the combustion chamber (15). The poppet valve (20) is reciprocated in the combustion chamber (15) by the pressure of the pressurized combustible mixture and the pressure of the combustion gases. The poppet valve (20) regulates the flow of the combustible mixture into the combustible chamber. The pulsing combustion device (10) may be utilized in a steam cleaning device wherein the pulsing combustion device is surrounded by a flow of liquid.

The pulsing combustion device may also be utilized for home heating with a fluid heated by the combustion device.

17 Claims, 14 Drawing Figures

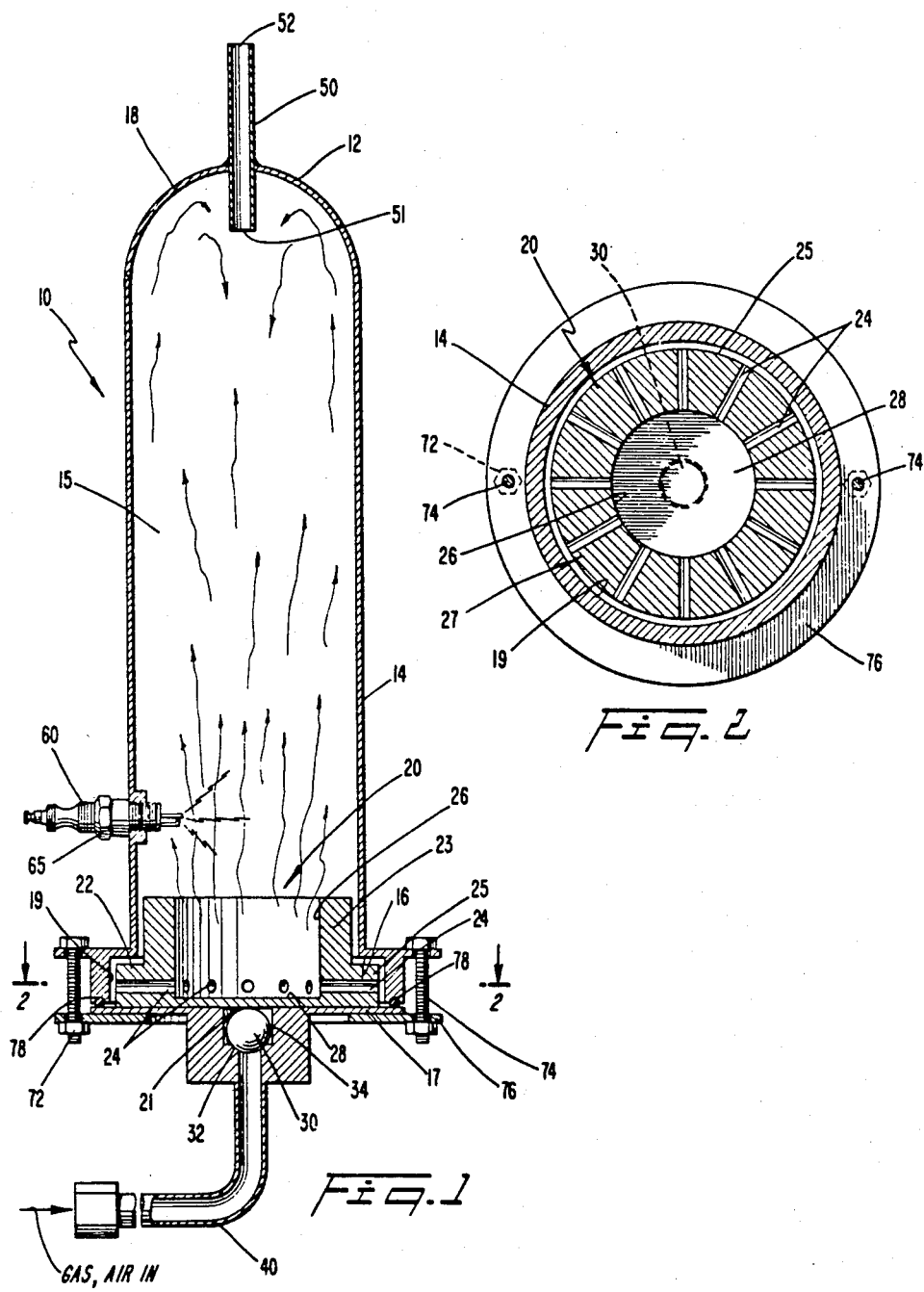

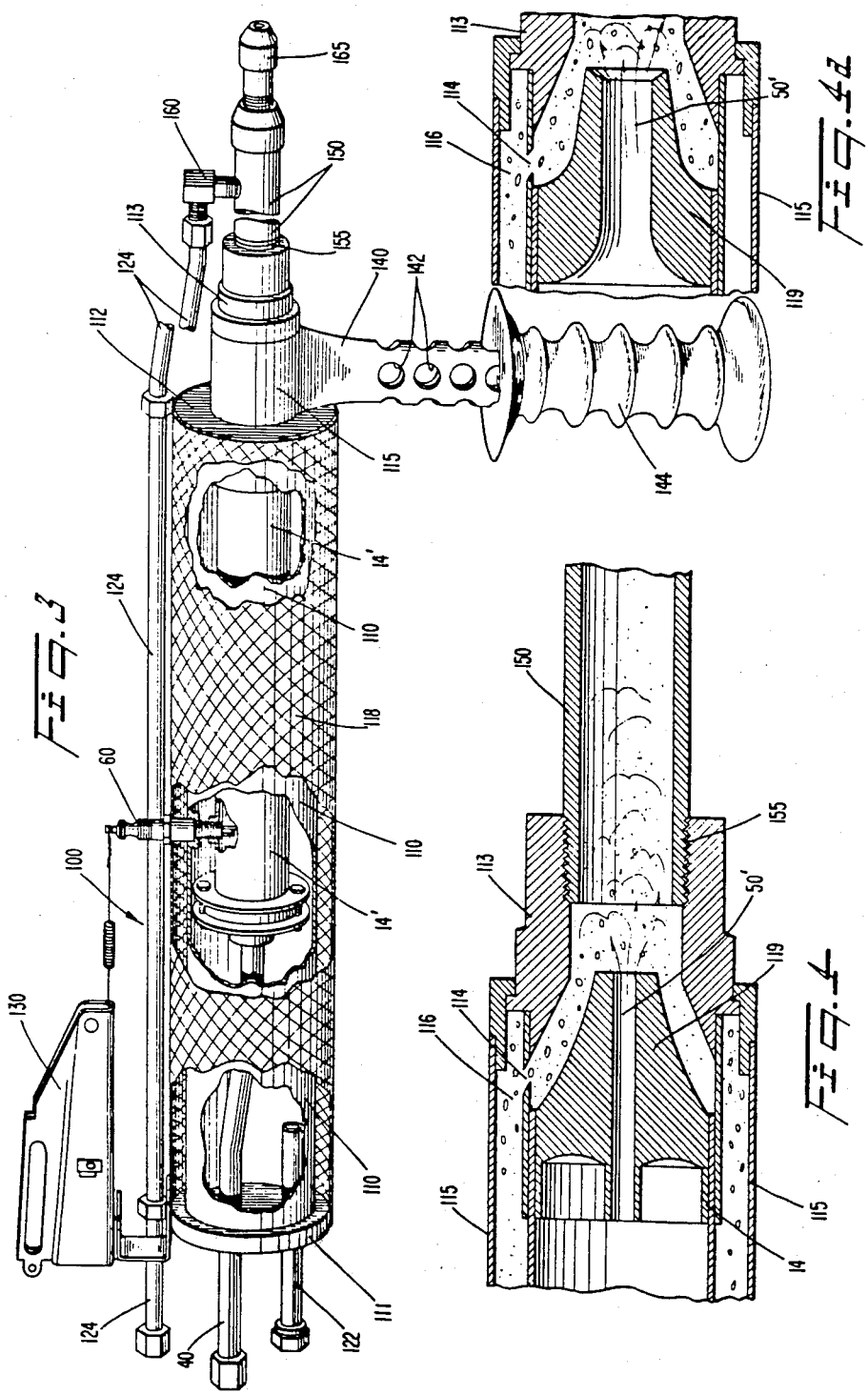

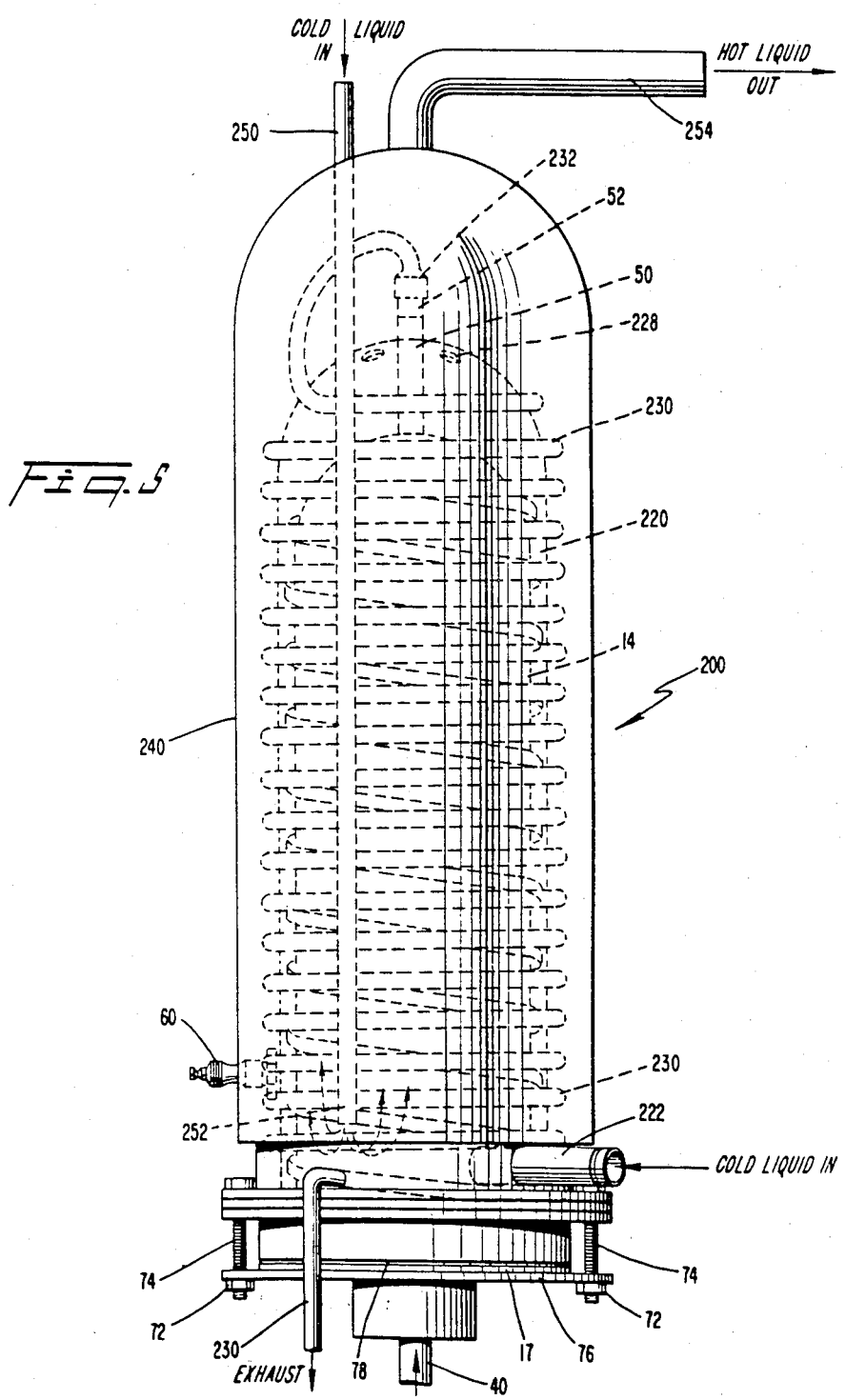

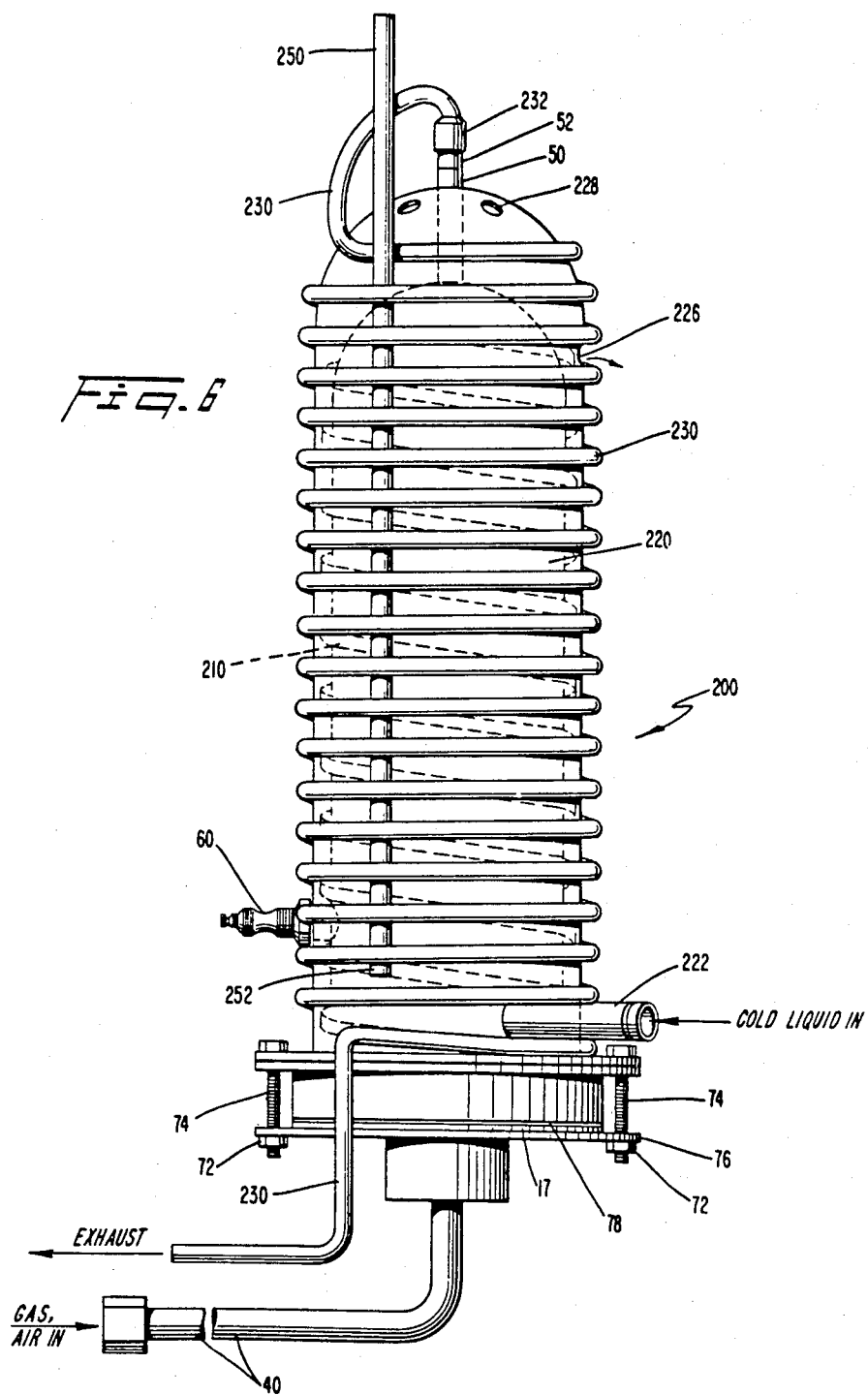

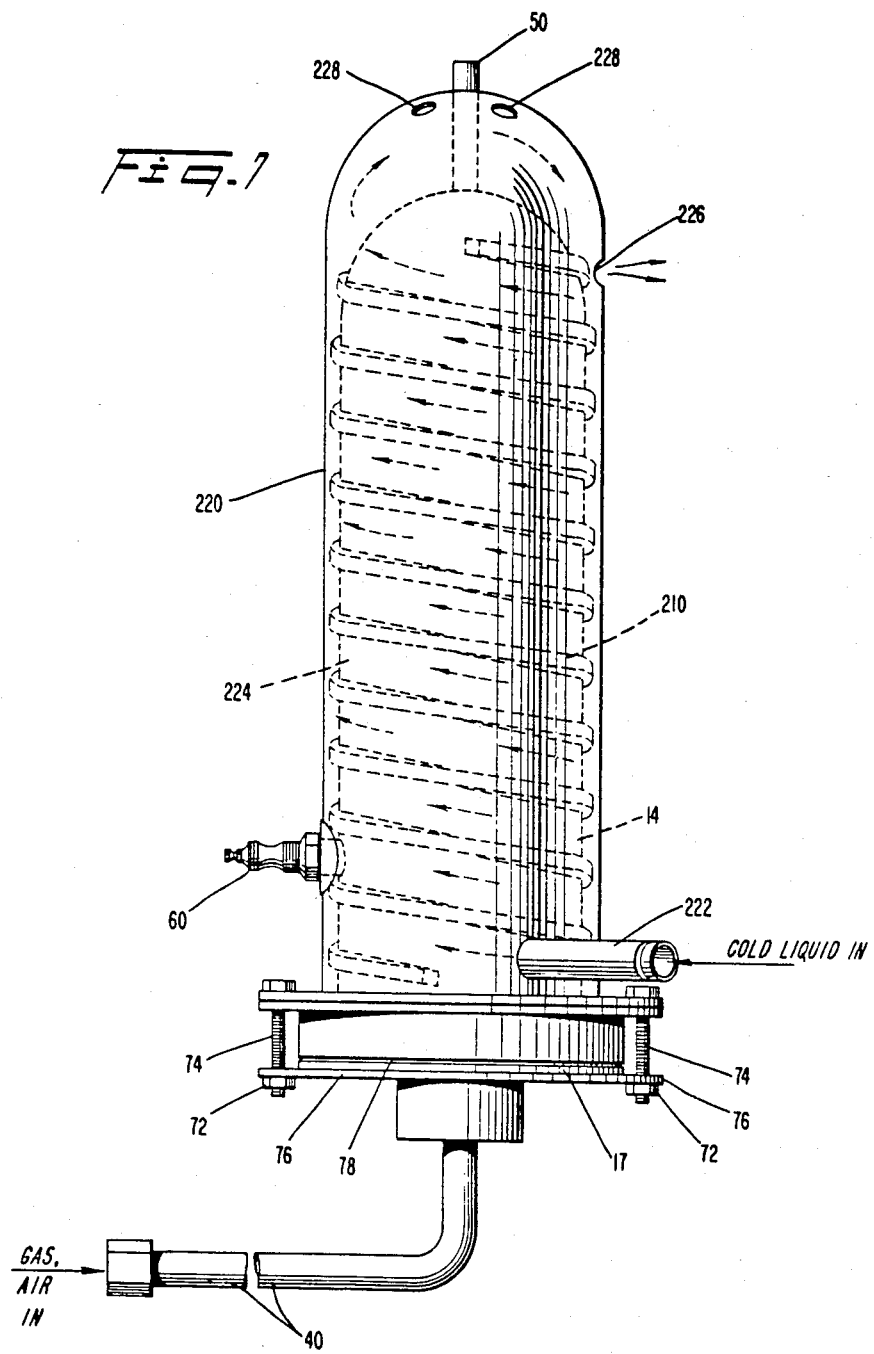

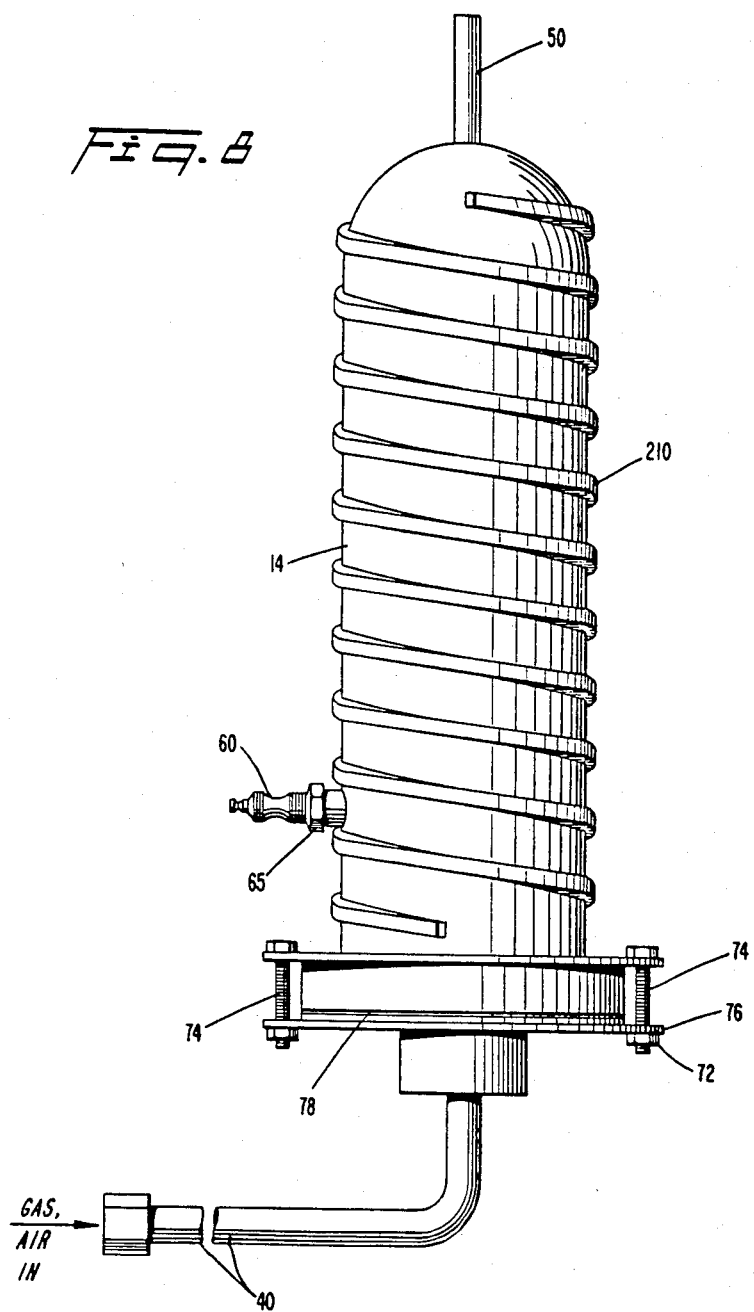

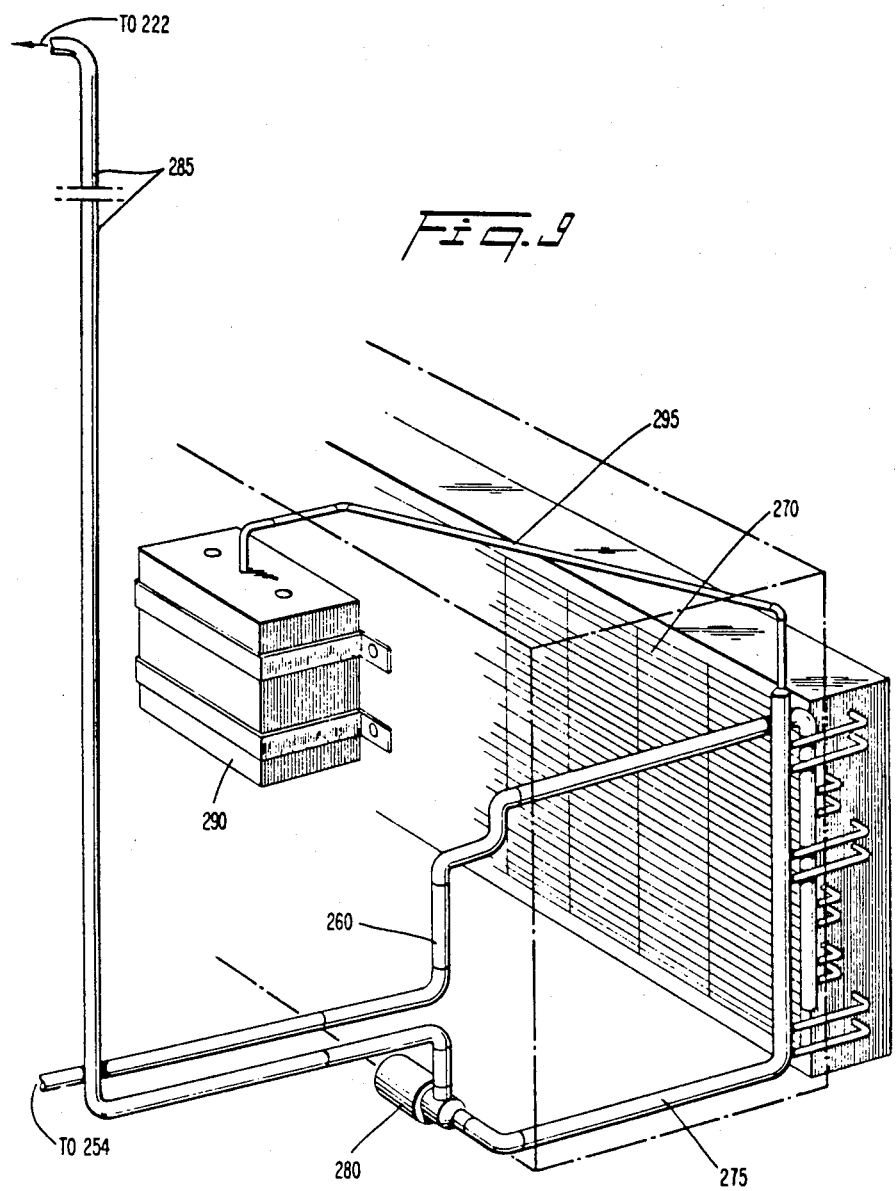

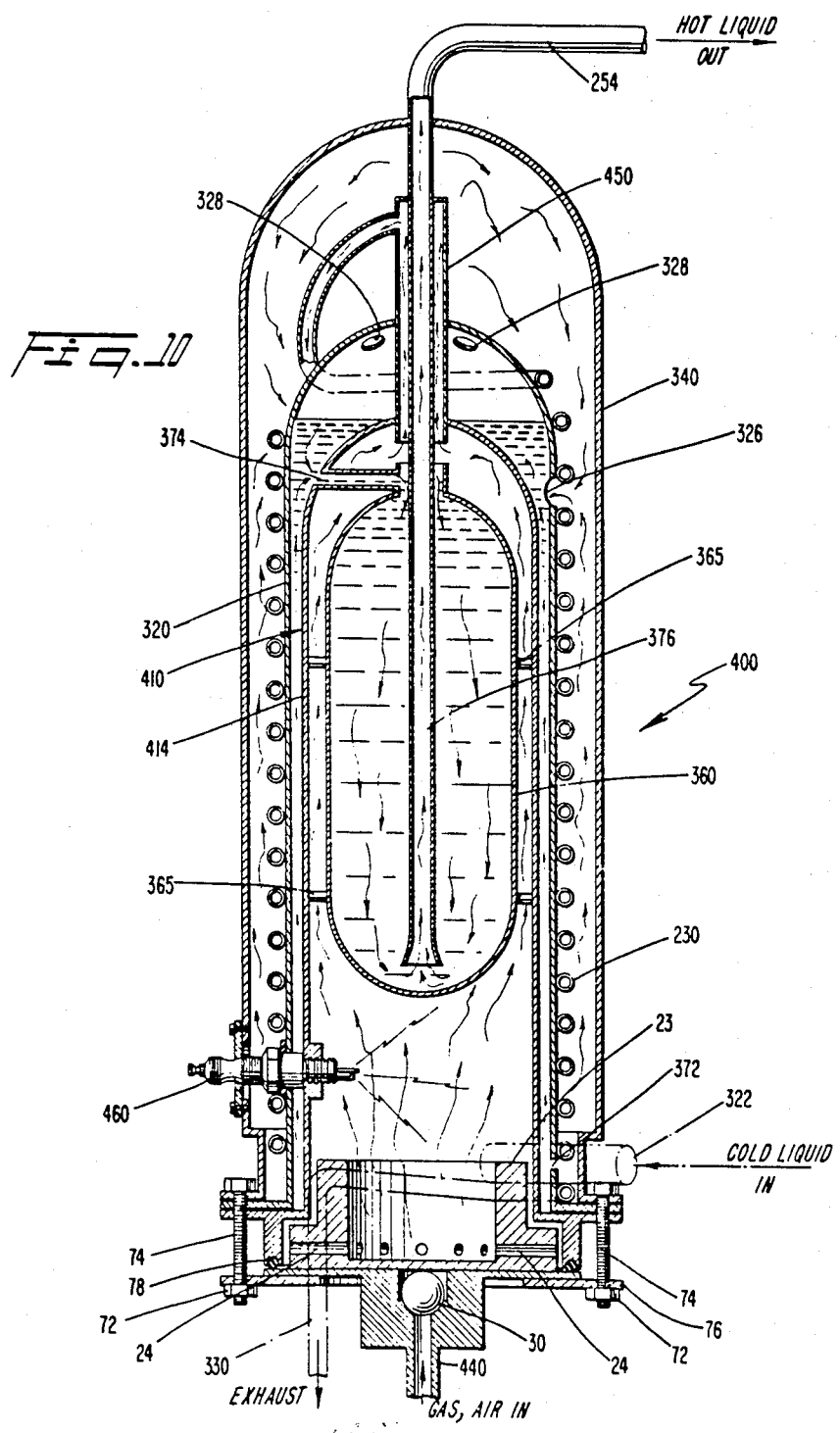

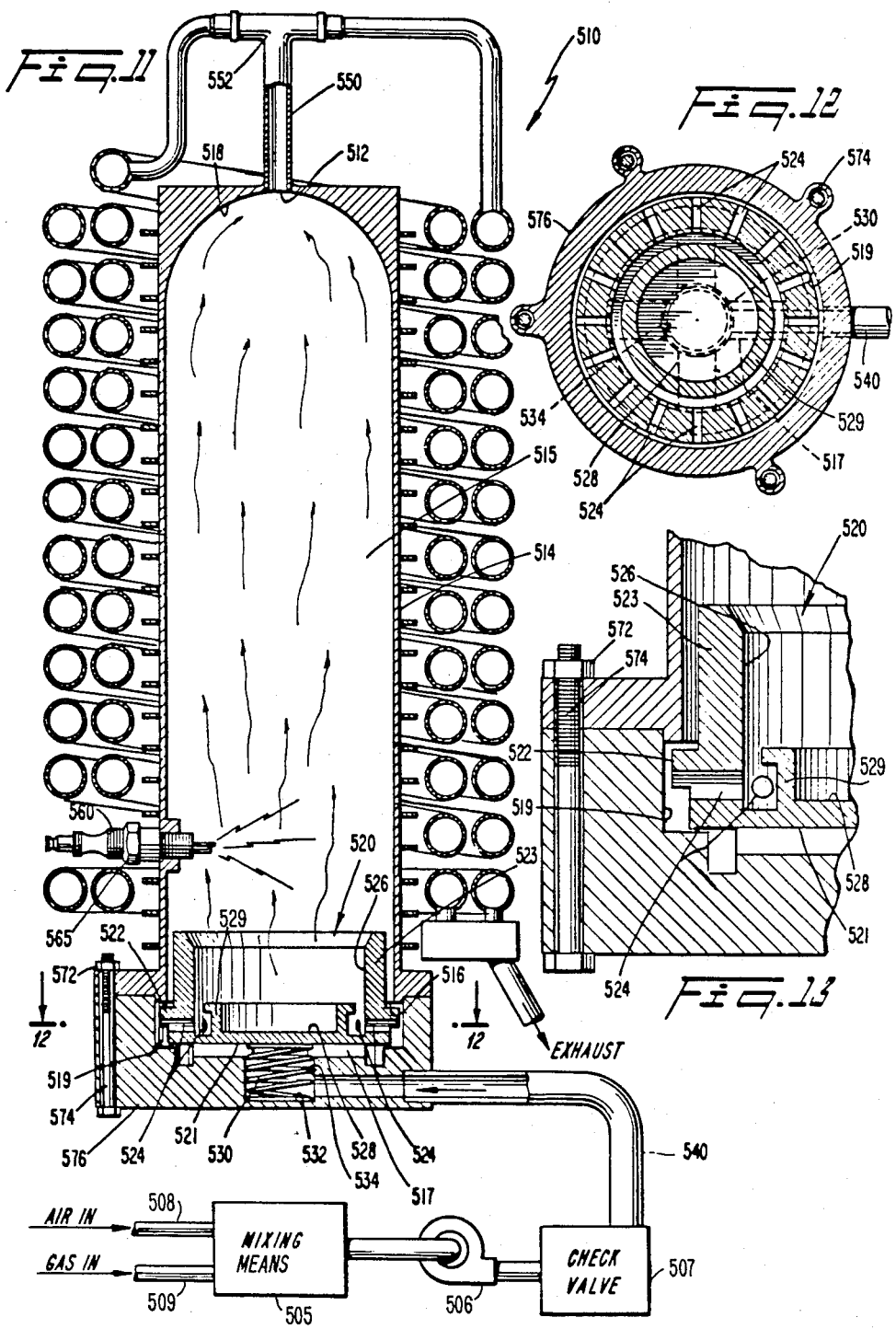

PULSING COMBUSTION

TECHNICAL FIELD

The invention disclosed herein pertains generally to improvements in combustors or burners and more particularly relates to gas and liquid heaters and steam generators having an improved combustor.

BACKGROUND ART

A vast number of burner arrangements are known for a virtually limitless number of specific uses. Typically, combustion takes place in an open combustion zone with the combustion gases then passed through a heat exchanger to heat a fluid such as air or water. Conventional combustion devices are unsatisfactory since oftentimes combustion is incomplete producing various pollutants and furthermore because the efficiency obtainable from such combustion devices is relatively poor.

The known burners or combustors used for heating liquids such as water are generally quite massive and consume large amounts of fuel (usually oil or gas). Most presently used burners rely on a continuous flow of the fuel, thus perhaps wasting some of the fuel due to incomplete combustion. Combustion devices having an intermittent flow of fuel are known, for example, as in a conventional piston engine or in a pulsing combustor. Perhaps one of the first pulsing combustors was the pulse-jet engine utilized in the German V-1 rocket or buzz bomb which is described on pages 2 and 3 of the book *Rocket Propulsion Elements* by George P. Sutton (John Wiley & Sons, 1949).

Another known pulsing combustor is disclosed in U.S. Pat. No. 2,857,332 to Tenney et al and is utilized in a machine for producing dispersions of liquid in air or other gases. In the Tenney et al device, a fuel-air mixture is supplied through an inlet portion of a combustor with combustion air passing sequentially through a throat or an air inlet passage and over a sloping step in a fuel injection tube. Fuel is discharged as a spray and is metered in proportion to the incoming air. The fuel-air mixture is forced through a plurality of diverging passages into a combustion zone of the combustor. The passages each have a port at the combustion chamber end of each passage. Each port is covered by a finger-like portion of a metal valve preferably made of a flexible steel. The finger-like portions of the valve are sufficiently flexible to be deflected against a backing plate by the inrush of the air-fuel mixture when the burner is operating.

Initially, the starting air-fuel mixture is introduced into the burner chamber and is ignited by a spark plug. The resulting explosion causes the finger-like portions of the valve to close against the intake ports leaving an exhaust tube as the only path of exit for the combustion zone gases. The mass of gases in the exhaust tube is then driven forceably at extremely high velocity outwardly of an open end of the exhaust tube by the expanding combustion gases produced by the explosion in the combustion zone The rush of gases out of the exhaust tube causes a low pressure area in the combustion zone. The low pressure area induces a fresh charge of combustible air fuel mixture through the ports and into the combustion zone. Fuel is fed to the combustion zone through a plurality of fuel ports and the air used is atmospheric air. The burner depends on the low pressure zone existing in the combustion chamber after exhaustion of the hot combustion products to induce a further flow of the air-fuel mixture into the combustion zone.

A resonant intermittent combustion heater system using a pulsing combustion arrangement similar to the pulsing combustor disclosed in U.S. Pat. No. 2,857,332 is also known in the prior art and is disclosed in U.S. Pat. No. 2,715,390 issued to Tenney et al.

A different pulsing combustion arrangement having a burner is disclosed in U.S. Pat. No. 2,959,214 issued to Durr et al. During ignition of the burner in the Durr et al device, a spark plug is activated along with a pump to supply air through a conduit under pressure to a tightly closed fuel tank. The air streaming through the tube vaporizes an amount of fuel at a diaphragm and this mixture flows into a mixing tube. The mixing tube mixes the fuel-air mixture with a further supply of air and the resulting mixture then is ignited by the spark. The burning does not provide a complete combustion of the fuel-air mixture and therefore unburned combustible components circulate within a cyclone-form combustion tube before reaching an exhaust tube. As the burner continues to operate, a part of the cyclone-form combustion tube becomes hot and the unburned combustible components which enter the cyclone combustion tube are ignited. An explosion takes place within the combustion tube and the explosion provides a sudden blast of exhaust gases through the exhaust tube. These explosions follow each other uniformly and a resonant intermittent combustion takes place providing an automatic suction of fuel and air.

A spraying device having a different pulsing combustor with an oscillating burner resonator fed by a carburetor is disclosed in U.S. Pat. No. 3,758,036 issued to Bauder et al. A blower is set into operation so that a fuel whirling chamber is pressurized via a starting air pipe and fuel is supplied to the fuel whirling chamber by a tank through a nozzle. The fuel-air mixture is then supplied through a tube to the burner and an ignition device in the burner ignites the fuel-air mixture. During subsequent operation, air is drawn into a valve chamber through a suction valve provided on a front side of the carburetor and is mixed with fuel from the fuel nozzle. On a side wall of the carburetor is a lid which carries an adjusting device for the oscillating burner resonator. The adjusting device includes an air evacuating valve associated with the fuel whirling chamber and a pressure space enclosed by the lid. A diaphragm is sealed at its edges to an outside of the lid with a middle area of the diaphragm being connected to a valve closing part of the air evacuating valve.

The Bauder et al patent also discloses a portable spraying apparatus having a hand held gun. The burner in the Bauder et al patent is cooled by air in a surrounding cooling cover which obtains the air from a blower through a pipe. An oscillating tube, also surrounded by the cooling cover, conducts the hot combustion products away from the burner toward a front section of the cooling cover. A liquid agent is introduced by the nozzle into the oscillating pipe so that the hot combustion products of the burner will turn the liquid into a steam or mist which will be expelled through a widened end section of the gun.

A known recirculating burner is disclosed in U.S. Pat. No. 3,366,154 issued to Walsh et al which shows a compact portable burner useful in flame cultivation of crops. Some of the products of combustion are recirculated from a discharge end of the burner to a position between the discharge end and a venturi throat and just forward of an oil nozzle for the purpose of providing a clean flame and more efficient burning of the fuel. A recirculation jacket surrounds a central portion of the burner and has a top wall, a bottom wall and a pair of similar symmetrically disposed side walls in a predetermined outwardly spaced relation to top, bottom and side walls of the burner. The front ends of the jacket wall and the burner wall are joined together by a front shoulder. Similarly, the rear end of the jacket wall and the burner wall are joined together by a rear shoulder. A plurality of openings is provided in the burner walls adjacent and slightly rearwardly of the front shoulder and a similar plurality of openings is provided adjacent and slightly forwardly of the rear shoulder. Hot combustion gas enters the plurality of front shoulder openings and is recirculated to the rear and reenters the burner by venturi action at the rear shoulder openings to provide a more efficient burning of the fuel as well as improved vaporization of the fuel which is preferably fuel oil.

U.S. Pat. No. 3,718,805 issued to Posey discloses a heated fluid gun in which the fluid is heated by an electrical cartridge surrounded by a fluid channel. A fluid enters the fluid channel through a rear entrance and flows around and is heated by the heater cartridge. The heated fluid flows into a fluid expansion chamber located within a barrel of the gun. A fluid additive nozzle introduces an additional fluid such as a detergent into the stream of heated fluid downstream from the fluid expansion chamber and the heated fluid with the detergent is then discharged through an orifice located at a front surface of the gun.

Another portable steam cleaner having an electrical element heating the water is disclosed in U.S. Pat. No. 2,639,365 issued to Krampe et al on May 19, 1953.

Other patents and publications which disclose combustor arrangements of interest to the present invention include: U.S. Pat. No. 2,634,804 of Erickson; U.S. Pat. No. 2,589,566 of Neth et al; U.S. Pat. No. 2,077,323 of Hendrix; U.S. Pat. No. 2,411,675 of Alexander; U.S. Pat. No. 1,719,015 of Lewis; U.S. Pat. No. 1,885,040 of Arnold; U.S. Pat. No. 4,259,928 of Huber; British Pat. No. 166,455; French Pat. No. 1,366,565; and, "Pulsating Combustion: An Old Idea May Give Tomorrow's Boiler's A New Look", *Power*, pp. 88-91, August 1954.

Accordingly, the need exists for an improved burner which provides an efficient and economical use of fuel, a commodity which is getting more expensive with each passing day. Such an improved burner would have particular utility in steam generation devices and in home heating equipment especially where a fluid is to be heated by the combustion.

OBJECTS AND BRIEF DISCLOSURE OF INVENTION

It is therefore an object of the present invention to provide an improved combustion device having a poppet valve which reciprocates in a combustion chamber of the combustion device to regulate a supply of a combustible mixture to the combustion chamber. Such a device, according to the present invention, will be termed a HASER burner for Heat Amplification by Stimulated Energy Radiated.

It is therefore another object of the present invention to provide a pulsing combustion device which provides an efficient and economical use of fuel and which overcomes the disadvantages of known combustion devices.

Yet another object of the present invention is to provide a heating device having a pulsing combustion device (and especially a HASER combustor) wherein the combustion gases heat either a liquid or a gas, which liquid or gas cools the shell of the burner.

The need also exists for an improved burner which is useful in a vapor or steam cleaning machine. There is a need for a portable steam cleaning device which is simple and relatively inexpensive in construction and operation.

It is therefore yet another object of the present invention to provide a steam cleaning machine having a pulsing combustion device (and especially a HASER combustor) which is encased in a liquid passageway such that the burner heats the liquid (to form steam) while the liquid cools the shell of the burner.

The HASER combustor of the present invention is especially useful in a home heating system. Present home heating systems are often large and expensive as well as being energy-inefficient because much of the heating value of the fuel is wasted. It would be advantageous to provide a building heating system in which a simple and compact pulsing combustion device is used to heat the fluid medium by which the home is heated. This would provide a more efficient use of heating fuels, since in many of today's home heating systems a large percentage of the heat generated is lost through the chimney. The need therefore remains for a building heating system which efficiently utilizes heat energy contained in the combustion gases produced by the burner.

It is therefore still another object of the present invention to provide an efficient and low cost heating system for a building wherein the fluid medium which heats the home is itself heated by a compact pulsing combustion device (and especially a HASER combustor).

It is therefore yet still another object of the present invention to provide a building heating system in which the spent gases of combustion are utilized to improve the efficiency of the system.

A pulsing combustion device (or HASER combustor) according to the present invention comprises a combustion chamber with a poppet valve mounted for reciprocation in the combustion chamber. A pressurized combustible mixture is supplied to the poppet valve with the combustible mixture ignited in the combustion chamber. The poppet valve is reciprocated in the combustion chamber by the pressure of the pressurized combustible mixture and the pressure of the combustion gsaes. The poppet valve regulates the flow of the combustible mixture into the combustion chamber.

A steam cleaning device according to the present invention comprises a pulsing combustion device (or HASER combustor) surrounded by a flow of liquid. The liquid flows past and is heated by the pulsing combustion device while cooling an outer shell of the combustion chamber. The liquid then flows into an outlet with the combustion gases of the pulsing combustion device also flowing into the outlet. The liquid, preferably water, is then vaporized to create steam before exiting from the cleaning device. Preferably, a detergent is added to the steam to increase the cleaning efficiency of the device.

An enclosure heating device according to the present invention comprises a pulsing combustion device (or HASER combustor) having a flow of fluid (either liquid or gas) encircling the combustion chamber so that the fluid is heated. In one embodiment, the pulsing combustion device has an outer shell which is cooled by a liquid which flows over the shell and also has an inlet orifice and an outlet orifice of a diameter considerably smaller than the cross-sectional diameter of the shell. The liquid preferably recirculates through a first and a second cold liquid inlet tube to provide cold liquid to both an internal water jacket enclosing the pulsing combustion device and an external water jacket enclosing the internal water jacket. A hot liquid outlet tube preferably conducts the heated liquid away from the liquid recirculating means. The heated liquid may be conducted to a heat exchanger which transfers the heat from the heated liquid to a building or other enclosure.

BRIEF DESCRIPTION OF THE DRAWINGS

A preferred embodiment of a pulsing combustion device and preferred embodiments of a steam cleaning device and enclosure heating devices, both of the latter including the pulsing combustion device, according to the present invention are described with reference to the accompanying drawings wherein like members bear like reference numerals and wherein:

FIG. 1 is a cross sectional view of a pulsing combustion device according to the present invention;

FIG. 2 is a view through the line 2—2 of FIG. 1;

FIG. 3 is a side view, partially in cross section, of a preferred embodiment of the steam cleaning device according to the present invention;

FIG. 4 is a cross-sectional view of a portion of the steam cleaning device of FIG. 3;

FIG. 4a is a cross-sectional view of a preferred embodiment of the portion of the steam cleaning device of FIG. 4;

FIG. 5 is a side view of a preferred embodiment of a heating device according to the present invention;

FIG. 6 is a side view of an interior of the heating device of FIG. 5;

FIG. 7 is a side view of an interior of the heating device of FIG. 6;

FIG. 8 is a side view of an interior of the heating device of FIG. 7;

FIG. 9 is a perspective view of a hot and cold liquid circulation system for the enclosure heating device of FIG. 5;

FIG. 10 is a cross-sectional view of another preferred embodment of a heating device according to the present invention;

FIG. 11 is a cross-sectional view of another preferred embodiment of a heating device according to the present invention;

FIG. 12 is a view through the line 12—12 of FIG. 11; and

FIG. 13 is an enlarged view of a portion of the preferred embodiment of FIG. 11.

DETAILED DESCRIPTION OF THE BEST MODES FOR CARRYING OUT THE INVENTION AND THE PREFERRED EMBODIMENTS

With reference to FIG. 1, a preferred embodiment of a pulsing combustion device 10 (or HASER combustor) according to the present invention, includes an elongate combustion chamber shell or burner shell 14 which defines a combustion chamber 15. The combustion chamber shell 14 is generally tubular with a length that is considerably greater than its width. The combustion chamber shell is preferably circular in cross-section, but may of course be square, rectangular or of any other suitable configuration. The combustion chamber 15 is closed except for the outlet for combustion gases and the inlet for admitting the combustible mixture. The combustible mixture may be supplied by a line 40 through a ball valve chamber 34 by way of a reciprocating poppet valve 20. The ball valve chamber 34 is provided within an end cap 17 disposed at an inlet end of the combustor shell 14. The end cap 17 together with the combustor shell 14 define a path of reciprocation for the poppet valve 20. After combustion, the combustion gases exit through an exhaust tube 50 disposed at an exhaust and 18 of the combustor shell 14.

If desired, the ball valve chamber may be deleted or replaced by a suitable conventional check valve (see FIG. 11). The ball valve chamber 34 or the check valve serves to prevent a flashback of the combustible mixture. If desired, a spring may be provided in the ball valve chamber (instead of the ball) to assist in the upward movement of the poppet valve 20.

The ball valve chamber 34 and the exhaust tube 50 have diameters which are considerably smaller than the cross-sectional diameter of the burner shell 14. Thus, the burner shell 14 is substantially closed on each end and has two restricted passageways: the ball valve chamber 34 at the inlet to the combustion chamber 15 and the exhaust tube 50 disposed at the exhaust end 18 of the burner shell 14. The burner shell 14, the ball valve chamber 34 and the exhaust tube 50 are all preferably made of a temperature resistant steel or other material which can tolerate the high temperatures generated in the combustion chamber while the combustible mixture is burning.

A flange 76 is secured (for example, by welding), to the end cap 17 to facilitate the assembly of the end cap 17 with the shell 14. A plurality of bolts 74 extend through openings in the flange and are threadably received by corresponding nuts 72 which are secured (as by welding) to the shell 14. The end cap 17 is thereby detachably secured to the shell 14 by the nuts 72 and the bolts 74. A sealing gasket 78, preferably of neoprene or another gasket material suitable for high temperature use may be preferably disposed between the end cap 17 and a lower end wall of the burner shell 14.

The poppet valve 20 disposed for reciprocal movement in the burner or combustor shell 14 is generally mushroom-shaped with an open interior or bore 26 (see also FIG. 2). The poppet valve 20 is of integral construction and includes a base 27 having a first diameter and a tube 23 having a reduced diameter with the bore extending through the tube and through a portion of the base. A small clearance is provided between a side wall 25 of the base of the poppet valve and a side wall 19 of a base portion of the burner shell 14 to allow the combustible mixture to flow therethrough. The side wall 19 of the burner shell 14 is disposed between an annular shoulder portion 16 and the end cap 17 of the burner shell 14. The poppet valve 20 is preferably made of a temperature resistant metal or other suitable material for high temperature use.

The poppet valve 20 is disposed within the combustor shell 14 for reciprocation between the annular shoulder 16 provided on a lower portion of the combustor shell 14 and the cap 17 of the combustor shell 14. A corresponding annular shoulder 22 on the base portion of the poppet valve 20 limits forward movement of the poppet valve 20 when the shoulder 22 of the poppet valve contacts the shoulder 16 of the burner shell 14. Rearward movement of the poppet valve 20 is limited by contact of a rear surface 21 of the poppet valve 20 with an inside surface 11 of the cap 17 of the combustor shell 14. A plurality of ports 24 are disposed about the poppet valve 20 beneath the shoulder 22 of the poppet valve 20 and provides communication between the bore of the poppet valve and the small clearance between the side wall 25 and the side wall 19. The ports 24 are preferably arranged substantially parallel to the rear surface 21 of the poppet valve 20 and extend radially from the bore.

A spark plug 60 extends into the combustion chamber through a threaded bore in the combustor chamber shell 14. The spark plug 60 is provided to initially ignite the combustion gases in the shell 14. The spark plug 60 is preferably threaded as at 65 into the combustion chamber shell 14 so as to provide a seal between the spark plug 60 and the combustor shell 14. The spark plug 60 is disposed near the poppet valve 20 but far enough from the inlet end of the combustion chamber 15 to not interfere with the reciprocation of the poppet valve 20.

The ball check valve provided in the combustible mixture supply line 40 includes a smooth ball 30 arranged to reciprocate toward and away from a rear seat 32 of the ball valve chamber 34. The ball 30 is preferably maintained in contact with the rear surface 21 of the poppet valve 20. Furthermore, the extent of reciprocation of the poppet valve 20 is preferably small with respect to the diameter of the ball 30, so that the ball 30 is held within the chamber 34 by the poppet valve 20 during reciprocation. Still further, it is preferred that the poppet valve seat snugly against the ball 30 when the ball is received on the rear seat 32 so that the poppet valve 30 may maintain a sealing relationship for the ball and seat 32 when the poppet valve is in contact with the end cap 17. Alternatively, various arrangements may be provided at a front end of the ball valve 34 such as fingers or a lattice to retain the ball 30 in the ball valve chamber 34. The ball check valve during reciprocation assists in the regulation of the flow of combustible mixture into the combustion chamber 15 along with the poppet valve 20.

The ball valve 30 also prevents backfire through the supply line 40 by preventing a flame in the combustion chamber 15 from spreading backwardly into the combustible mixture supply line 40. If desired, additional or different backfire prevention devices (such as a suitable, conventional check valve) could be provided upstream of the ball valve 34 or instead of the ball valve 34.

The exhaust tube 50 at the exhaust end 18 of the burner shell 14 has a first end 51 disposed inside the burner shell 14 and a second end 52 disposed outside the burner shell 14. The exhaust tube 50 is relatively small in cross-sectional diameter with respect to the burner shell 14. The burner shell 14 preferably has a sloping or curving exhaust end surface 12 which slopes inwardly toward the exhaust tube 50 and with the tube 50 preferably ending at (or perhaps extending only slightly through) a central portion of the end surface 12. If the inner end of the exhaust tube 50 protrudes too far into the combustion chamber 15, the efficient operation of the chamber may be interrupted. It is preferable, however, to have the end surface 12 curved or sloping to provide a tornadic action which is believed to cause intense heat and complete combustion of the combustible mixture and therefore a more efficient use of the fuel within the pulsing combustor.

It is to be noted that the exhaust tube 50 may have to be adjusted in size and location to "tune" the exhaust flow from the combustion chamber shell or burner shell 14. By "tuning" the exhaust tube 50, the desired operating characteristics of the burner namely, the number of explosions per minute, the pressure in the combustion chamber 15, the velocity of the gas exhausted and other such factors may be optimized. For example, if the tube diameter is too large, the combustion of the gases may not produce a sufficient pressure to reciprocate the poppet valve 20.

Generally it can be stated that the burner shell 14 is considerably longer and larger in diameter than the exhaust tube 50. The appropriately sized exhaust tube 50 is rigidly secured to the combustion chamber shell 14, preferably by welding. The appropriate relative dimensions for the shell 14, the exhaust tube 50 and the poppet valve 20 will be readily determined experimentally by one skilled in the art upon reading the present specification. Specifically, in each embodiment, it is recommended that values for all but one of the variables be preselected with the remaining variable sized according to the preferred operation of the device.

During operation, a pressurized combustible mixture is supplied to the poppet valve through the combustible mixture supply line 40 by way of the ball valve chamber 34. The combustible mixture is preferably an air and gas combination with the gas preferably being either natural gas or propane although pure ethane, pure methane or other combustible gases would also suffice. Gas and air are mixed through a suitable, conventional valving system, from an air compressor, and a source of fuel gas (not illustrated), in a suitable, conventional manner to form the combustible mixture which is supplied to the combustible mixture supply line 40.

The combustible mixture flow initially lifts the ball valve 30 from its seat 32 in the ball valve chamber and (since the ball is in contact with the rear surface 21 of the poppet valve 20) the poppet valve 20 is also lifted so that the combustible mixture can flow around the ball valve 30 into the small clearance between the poppet valve side wall 25 and the side wall 19 of the shell 14. The combustible mixture may then flow through the ports 24 into the combustion chamber by way of the bore 26 of the poppet valve. The combustible mixture also pushes against the rear surface 21 of the poppet valve 20 and thereby lifts the poppet valve 20 away from the end cap 17 of the burner shell 14. With continued pressure against the rear surface 21, the shoulder 22 of the poppet valve 20 contacts and seats against the shoulder 16 of the burner shell 14.

Since the poppet valve 20 floats on a cushion of the combustible mixture, no lubrication of the poppet valve is needed. Note also that unlike the normal poppet valve which is either cam operated or spring loaded, the poppet valve of the present invention is reciprocated by the pressure differential between a pressure in the combustion chamber 15 and a pressure in the combustible mixture supply line 40, (but with the assistance of a spring in some embodiments).

The combustible mixture then flows between the side wall 19 of the burner shell 14 and the side wall 25 of the poppet valve 20. The mixture flows around and through the ports 24 in the poppet valve 20 and into the open interior 26 thereof. Note that because the shoulder 22 of the poppet valve 20 is in a sealing contact with the shoulder 16 of the burner 14, the combustible mixture is constrained to flow through the ports 24 in the poppet valve 20. The combustible mixture then flows out a front bore 26 in the poppet valve 20 and flows into a main portion of the burner shell 14.

After the combustible mixture has first entered the combustion chamber 15, the spark plug 60 is fired once to initially ignite the mixture. Once the spark plug 60 has initially ignited the combustible mixture the spark plug 60 is no longer utilized. Instead, further ignition of the combustion mixture occurs due to the heat still retained in the combustion chamber 15. When a new charge of combustible mixture is admitted into the combustion chamber 15, the hot products of combustion in combination with pressure and/or shock waves (due to the high velocity flows) ignite the fresh combustion mixture. Thus the combustion, charging and ignition process repeats itself automatically and continuously.

Combustion thereupon takes place and the explosion of the combustible mixture increases the pressure within the combustion chamber and thereby forces the poppet valve 20 to seat itself against the inner surface 11 of the cap 17 of the burner shell 14. At the same time, the ball valve 30 is forced to seat itself on the ball valve seat 32 of the ball valve chamber 34. With the ball 30 seated and the poppet valve 20 also seated, a double seal is provided to prevent the combustible mixture from backfiring by flowing into the combustion mixture supply line 40.

As the burned combustible mixture is exhausted from the combustion chamber 15 through the exhaust tube 50, the pressure in the combustion chamber 15 decreases. When the pressure in the combustion chamber 15 has decreased sufficiently (for example, to an effective pressure below the effective pressure of the combustible mixture in the combustible mixture supply line 40), the pressure of the combustible mixture forces the poppet valve 20 upwardly from the cap 17 of the burner shell 14 to repeat the process. With the pressurized mixture pushing against the rear surface 21 of the poppet valve 20 and the hot exhaust products pushing on an inside rear surface 28 of the poppet valve 20, the poppet valve acts like a differential piston. When the poppet valve is in its lowermost position, the area on which the exhaust products pressure acts, (the cross-sectional area of the poppet valve base 27), is significantly larger than the area on which the combustible mixture pressure acts, (only the cross sectional area of the supply line 40). Thus a lower pressure (than the pressure in the combustible mixture supply line 40) is generally required in the combustion chamber 15 before the poppet valve 20 is lifted from engagement with the end cap 17 of the burner shell 14. The length of reciprocation of the poppet valve 20 is smaller than the diameter of the ball valve 30 to ensure that the ball valve 30 stays in the ball valve chamber 34.

In this way, it should be noted that the pressure of the mixture in the line 40 acts on the exposed lower surface of the ball 30 when the ball is seated in the chamber 34 whereas the pressure of the combustion gases effectively acts on the entire cross-sectional area of the poppet valve. Thus a significantly lower pressure in the combustion chamber than in the supply line will keep the ball seated in the ball check valve. Once the pressure within the combustion chamber 15 has dropped sufficiently, however, the ball is unseated, the pressurized combustion gases rapidly begin to act on the entire lower surface of the poppet valve 20 with the result that the poppet valve is quickly driven upwardly against the shoulder 16. As soon as contact is made between the poppet valve shoulder 22 and the shoulder 16 of the burner shell 14, the effective area of the poppet valve on which the combustion gases act is reduced to the cross-sectional area of the combustion chamber. In this way, the pressurized combustion mixture may more easily maintain the poppet valve in the extreme uppermost position (during each reciprocation of the poppet valve).

After the combustion gases have expanded sufficiently, the force on the poppet valve upper surface will be sufficient to urge the poppet valve downwardly away from the surface 16. At that point, the effective surface area of the poppet valve (as seen by the combustion gases) increases with the result that the poppet valve is more easily urged downwardly. Furthermore, once the ball 30 seats in the ball check valve, the effective surface area of the poppet valve as seen by the combustion mixture is significantly reduced (to the cross-sectional area of the supply line 40). Thus the combustion gases may now more easily keep the poppet valve 20 and the ball 30 seated in the lowermost position.

Because the effective areas of the poppet valve on which the combustion mixture and combustion gases act are quickly changing during the reciprocation of the poppet valve, the speed at which the poppet valve travels is increased significantly. That is, the poppet valve moves quickly between its uppermost and lowermost positions because a slight movement of the poppet valve immediately results in a significant increase in the effective area of the dominant pressure. Thus, the varying surface area helps maintain the poppet valve in the uppermost and lowermost positions, but also help to quickly move the poppet valve between the positions.

The poppet valve 20 has a passageway provided in the front face whereas the rear surface 21 is completely closed. An upper section of the poppet valve 20 including the bore 26 is defined by an annular portion or tube 23 which is reduced in size with respect to the base portion 25 the poppet valve. The poppet valve is preferably machined from a solid piece of metal. The bore 26 extends completely through the upper section and only partially through the base portion 27 of the poppet valve 20. The plurality of ports 24, which are arranged radially communicate with the bore 26. The ports 24 extend into the bore 26 to provide a path of flow for the combustion mixture. The size and the number of the ports 24 in the poppet valve 20 depends upon the type of fuel used and the pressure at which the combustion mixture is supplied.

The combustion mixture preferably enters the combustion chamber only through the ports 24 (since the shoulder 22 of the poppet valve 20 contacts the shoulder 16 of the burner shell 14 when the check valve is open). Thus, the poppet valve 20 may serve as a flame holder or flame tube to initially contain the flame generated by the burning of the combustible mixture.

It is expected that the poppet valve 20 and ball 30 will reciprocate about 800 to 900 times per minute in the pulsating combustion device 10 and thus provide about 800 to 900 combustion pulses per minute, once for each reciprocation. The freqency of reciprocation depends upon the relative size of the combustor shell 14 and the exhaust tube 50. The frequency also depends upon the rate of flow of the fuel and air mixture through the poppet valve and therefore on the pressure at which the combustion gases are supplied.

One preferred embodiment of the present invention has a burner shell which is about 25 centimeters (ten inches) long with a diameter of about 2.5 centimeters (one inch) (i.e., a 10:1 ratio). The poppet valve is about 1 centimeter (three eights of an inch) in length and reciprocates through a length of approximately 0.5 centimeter (three sixteenths of an inch). The combustible mixture is pressurized to approximately 2.5–3.5 kg/cm$^2$(40–50 p.s.i.) with an air to propane mixture ratio of about 25 to 1. An interior temperature of approximately 925° C. was very quickly developed in the combustion chamber 15 after ignition of the combustible mixture.

With reference now to FIG. 3, a preferred embodiment of a portable steam cleaning apparatus according to the present invention includes a portable steam gun 100. A liquid passageway 110, having a reduced diameter front portion 115, surrounds the burner shell 14' with an expanded metal shroud 118 encircling the liquid passageway 110. The metal shroud 118 is secured to a rear disk 111, which defines the rear of the gun 100, and a front disk 112. The combustible mixture line 40 penetrates the rear disk 111 and the liquid passageway 110 to supply the combustible mixture to the pulsing combustion device 10. A liquid line 122 also penetrates the rear disk 111 and delivers liquid to the liquid passageway 110 to maintain a supply of a liquid, preferably water in the liquid passageway. A detergent line 124 is secured to an outer periphery of the steam gun 100.

The spark plug 60 extends through the expanded metal shroud 118, through the liquid containing chamber 110 and through the burner shell 14' into the combustion chamber 15. The spark plug 60 is ignited by a suitable source of electrical current and is preferably powered by a piezo-electric device 130 so as to eliminate the need for batteries or an electrical cord. A bracket 132 mounts the piezo-electric device 130 on the gun 100. It is important that the spark plug 60 be adequately sealed with respect to the burner shell 14 and the liquid passageway 110 because otherwise liquid might get into the combustion chamber 15 to extinguish the flame. Furthermore, hot gases could stream out into the liquid passageway if the spark plug is not sealed appropriately. It can be seen that the seal between the combustible mixture supply line, the ball valve chamber 34 and the burner shell 14 must be adequate to prevent liquid entry therebetween as such liquid entry would also be deleterious to the combustion process.

The burner shell 14' is provided with an exit port 50' (see FIG. 4a) defined by a plug 119 having a smooth outer surface 117 which extends into the reduced diameter front portion 115 of the liquid passageway 110. The plug 119 preferably tapers smoothly into the exit port 50' as illustrated in FIG. 4a. The embodiment of FIG. 4 (with the exit port 50' extending into the combustion chamber) is undesirable in many situations since the protrusion of the exit port 50' into the combustion chamber is believed to have a detrimental effect on the operation of the device.

An annulus 116 is disposed over the exhaust tube 50 at an exit portion of the burner shell 14' to regulate the flow of liquid and steam which passes by the exhaust port 50'. Preferably an appropriately sized orifice 114, for example, having a diameter of about 0.3 cm (one eight inch) is disposed in the annulus 116. The liquid then flows from the reduced diameter front portion 115 of the liquid passageway 110 through the orifice 114 and past the exhaust tube 50' by venturi action. The size of the orifice 114 regulates the amount of liquid and steam flowing past the exhaust tube 50' to prevent an excessive amount of liquid steam (to be completely vaporized) from flowing through the annulus. The annulus 116 may be rotatably mounted in the front portion 115 of the liquid passageway to more evenly distribute the liquid flowing through the orifice 114. The front portion 115 of the liquid passageway 110 terminates in an exit sleeve 113 which communicates with a vapor tube or steam tube 150.

The water is heated by contact with the burner shell 14' while the burner shell 14' is in turn cooled by contact with the water. As the water exits through the annulus 116 it mixes with the exhaust combustion products of the pulsing combustion device 10 while the exhaust products flow out of the exhaust tube 50'. The mixture of the hot exhaust products and the heated water turns the water into steam. The steam then flows down the vapor tube or steam tube 150 toward an outlet orifice 165. The steam tube 150 is preferably threaded as at 155 into the exit portion 113 of the liquid passageway 110. A detergent nipple 160 is disposed in the steam tube 150 near the outlet orifice 165 and preferably injects a detergent or a cleaning fluid into the steam. The steam and hot combustion products preferably vaporize the detergent flowing into the steam tube 150. The steam and hot exhaust products, now mixed with the vaporized detergent, then flow out the outlet orifice 165.

A handle or hand piece 140 is disposed on the portable steam gun 100. The hand piece 140 is secured to the reduced diameter front portion 115 of the liquid containing chamber 110 immediately in front of the front disk 112 and immediately behind the exit portion 113 of the liquid passageway 110. In this way, the gun is evenly distributed on either side of the handle to facilitate manipulation of the gun. The hand piece 140 has a plurality of ventilation holes 142 to keep the hand piece cool as well as a rubber grip 144 to allow for safe and non-slip hand hold of the gun 100.

The portable steam cleaning gun 100 may be used for steam cleaning objects such as automobile engines, industrial equipment, manufacturing plant areas, the floors and walls of commercial establishments and the like in a manner which is conventional in the art.

In operation, water is first allowed to flow over the combustion chamber and then the flow of the combustible mixture is initiated. The pressurized combustible mixture flows through the combustible mixture line and pushes the ball valve 30 away from the ball valve seat 32 in the ball valve chamber 34. The pressurized combustible mixture simultaneously pushes the rear surface 21 of the poppet valve 20 away from sealing engagment with the inlet end surface 11 of the end cap 17 of the burner shell 14'. The poppet valve 20 is propelled upwardly until the shoulder 22 thereof engages the shoulder 16 of the burner shell 14'. The combustible mixture flows into the poppet valve 20 through the ports 24 therein and then flows into the main portion of the combustion chamber 15. The spark plug 60 is then fired once.

The exploding mixture creates a great pressure surge and also liberates a large amount of heat. The pressure surge propels the poppet valve 20 back into engagement with the inlet end surface 11 of the end cap 17 of the burner shell 14' as explaned above. The heat generated by the explosion is at least partially transmitted to the burner shell 14'. The burner shell 14', again preferably made of a high temperature tolerant metal and in this case preferably a non-corroding metal as well, then conducts the heat to the liquid flowing through the liquid passageway 110. The liquid is heated and eventually flows through the annulus 116 between the liquid passageway 110 and the burner 10 and into the steam tube 150. In the steam tube the liquid is vaporized by the hot combustion gases exhausted by the exhaust tube 50 of the burner 10.

A detergent or cleaning fluid may also be piped into the steam tube 150, through the detergent nipple 160 near the outlet orifice 165 thereof. The detergent (now vaporized by the hot exhaust products) and steam along with the hot exhaust products are all exhausted through the outlet orifice 165 of the gun 100. The detergent nipple 160 is located near the outlet orifice 165 to ensure that the detergent will not adversely affect (that is, rust or corrode) the steam tube 150.

A preferred embodiment of the steam gun 100 weights only about 2.5 kg (five and one half pounds) and has a burner shell 14' which is about 2.5 cm (one inch) in diameter and 25 cm (ten inches) in length. It is estimated that the steam gun 100 uses only 25% of the fuel that would be needed by a conventional steam cleaning apparatus. Preferably a portable enclosure housing an air compressor, a fuel tank, a supply of pressurized water and a detergent tank (not illustrated) are provided. Of course, the gun could be utilized in the same manner with non-portable supply components.

With reference now to FIG. 8, a first preferred embodiment of an enclosure or building heating device according to the present invention includes the pulsing combustion device 10 (or HASER burner) as described in connection with FIG. 1. The burner shell 14, the spark plug 60 and the combustible mixture supply line 40 are provided along with the exhaust tube 50 in the manner described above. A steel strap 210, however, is preferably welded to an outer surface of the burner shell 14 in a spiral or helical form.

With reference now to FIG. 7, an inner liquid shell 220 encases the burner shell 14. An inlet tube 222 delivers cold liquid into the inner liquid jacket or shell 220. The cold liquid spirals upwardly in the inner liquid shell 220 around the burner shell 14, as at 224, guided by the steel strap 210. The cold liquid is heated thereby while the burner shell 14 is cooled. A portion of the now-warmed liquid exhausts through an exhaust port 226 near an upper periphery of the inner liquid shell 220. Two weep holes 228, which are disposed at an upper periphery of the inner liquid shell 220 nearby the location where the inner liquid shell 220 is pierced by the exhaust tube 50 of the burner 10, are also used to exhaust warmed liquid from the inner liquid shell 220. The two weep holes 228 are each preferably half the size of the exhaust port 226 so that an approximately equal amount of heated fluid is exhausted through the exhaust port 226 and the weep holes 228. It is important that the system be fluid tight so that no water enters the exhaust tube 50 or the burner shell 14 since water entry might be deleterious to the burning process.

The two bolts 74 removably attach the cap 17 of the burner shell 14 to respective bolts 72 secured to the inner liquid shell 220 (as in the embodiment of FIG. 1) so that the poppet valve 20 may be removed from the HASER burner 10. If a different fuel is selected to be burned in the pulsing combustion device 10 a differently sized poppet valve 20 may be necessary.

It is important that the pulsing combustion device be water-tight because any water entering the combustion chamber might adversely affect the combustion process. It is thus important that the end cap 17 of the burner shell 14 fit precisely. An imprecise fit would also adversely affect the ability of the pulsing combustion device 10 to build up the pressures necessary for efficient operation since with an imprecise fit gases could escape at the cap 17 of the burner shell 14. Preferably, the inner liquid shell bottom and the burner shell 14 are welded together to provide a water-tight fit.

With reference now to FIG. 6, an exhaust conduit 230 is coiled around the inner liquid shell 220. In the illustrated preferred embodiment, the exhaust conduit 230 comprises approximately 6.5 meters (twenty two feet) of coil tubing (having a diameter of about 1.25 cm or one-half inch) preferably of a corrosion resistant high temperature tolerant metal. The exhaust conduit 230 communicates at a first end 232 thereof with the second end 52 of the exhaust tube 50 to conduct the exhaust gases around the inner liquid shell 220 to heat the liquid in the liquid jacket. The exhaust conduit 230 coils in a downwardly sloping fashion around the inner liquid shell 220 until it passes near a bottom periphery of the building heating apparatus 200 and terminates in an outlet end 234. At that point the exhaust gases are conducted away from the building heating apparatus 200 and may be directed to a conventional flue or chimney (not illustrated).

With reference now to FIG. 5, an outer liquid jacket or shell 240 encloses the exhaust conduit 230. A second cold liquid inlet tube 250 extends within the outer liquid shell 240 and is partially encircled by the exhaust conduit 230. The second cold liquid inlet tube 250 terminates at a bottom orifice 252 near the spark plug 60 and cold liquid exiting from the bottom orifice 252 circulates upward around the exhaust conduit 230. The now-warmed liquid from the second cold liquid inlet tube 250 mixes with the warm liquid streaming through the exhaust port 226 in the liquid shell 220 and with the liquid flowing out through the weep holes 228 in the inner liquid shell 220. The mixed hot liquid is exhausted through an outlet tube 254 disposed at an apex of the outer liquid shell 240.

With reference now to FIG. 9, the hot liquid exhausted from the hot liquid exhaust tube 254 is then routed through a hot liquid conduit 260 to a coil radiator 270 which forms the duct work of a heating system for a building. A fan, (not illustrated), may then blow through the coil radiator to transfer heat to the building. A circulating pump 280 delivers the now cooled liquid from a radiator discharge pipe 275 through a liquid return pipe 285 back to the cold liquid intake pipe 222. A header or expansion tank 290, connected to the radiator discharge pipe 275 by a connection pipe 295, keeps the system full. Heat transfer to the building may of course be accomplished by other means such as a suitable, conventional radiator system or the like.

The outer liquid shell 240 may be wrapped in insulation to increase the thermal efficiency of the system.

In the operation of the building heating device, the circulating pump 280 is started to begin the circulation of water through the cold liquid inlet pipes 222, 250 and the hot liquid outlet pipe 254. Thereupon the pressurized combustible mixture is admitted into the combustible mixture supply line 40. The pressurized combustible mixture lifts the ball valve 30 from its seat 32 in the ball valve chamber 34 and simultaneously the combustible mixture then pushes the poppet valve 20 away from engagement with the cap 17 of the burner shell 14 as explained above. The combustible mixture then flows between the side wall 19 of the burner shell 14 and the side wall 25 of the poppet valve 20 and into the ports 24 in the poppet valve 20. As the combustible mixture flows into and through the open interior 26 of the poppet valve 20 the spark plug 60 is fired.

The firing of the spark plug causes the ignition of the combustible mixture and a large amount of heat and pressure are generated in the combustion chamber 15. The pressure causes the poppet valve 20 to move quickly into engagement with the cap 17 of the burner shell 14 as outlined above. A portion of the heat generated by the burning is communicated to the burner shell 14.

The cold water flowing through the cold liquid inlet 222 flows into the inner liquid shell 220 which surrounds the burner shell 14. The cold liquid is then guided around the burner shell 14, in an upwardly spiraling path 224 by the steel strap 210. The contact between the hot burner shell and the cold liquid heats the liquid and cools the burner shell 14. The warmed liquid is vented from the inner liquid shell 220 by the exhaust port 226 and by the two weep holes 228. The weep holes 228 are located on either side of the exhaust tube 50 of the burner 10 to take advantage of the heat of the exhaust products in the exhaust tube 50. The now-warmed water exiting through the weep holes 228 and the exhaust port 226 exits into the outer liquid shell 240.

Inside the outer liquid shell 240 and coiling around the inner liquid shell 220 is the exhaust conduit 230. Hot exhaust gases are conducted from the exhaust tube 50 into the exhaust conduit 230 to heat the inner liquid shell 220 as well as the liquid in the outer liquid shell 240. Cold liquid from the second cold liquid inlet tube is delivered through the bottom orifice 252 thereof into the outer liquid shell 240. The cold liquid is heated by contact with the exhaust conduit 230 and also by contact with the inner liquid shell 220 as the cold liquid flows upwardly inside the outer liquid shell 240. A hot liquid exhaust tube 254, mounted at the apex of the outer liquid shell 240 conducts away the now-heated liquid.

The hot liquid exhaust tube 254 delivers the hot liquid via the hot liquid conduit 260 to the radiator 270 in which the hot liquid gives up its heat so that the building or other enclosure can be heated. The now-cooled liquid is led through the radiator discharge pipe 275 to the circulating pump 280. Any overflow goes from the radiator discharge pipe 275 through a connection pipe 295 to the header expansion tank 290. The circulating pump 280 delivers the now-cooled liquid through the liquid return pipe 285 back to the cold liquid inlet pipe 222 to start the process again.

With reference now to FIG. 10, a second preferred embodiment of an enclosure or building heating device 400 according to the present invention includes a pulsing combustion device 410 having a burner shell 414, a spark plug 460, a combustible mixture supply line 440 along with a exhaust tube 450. The pulsing combustion device is similar to that of FIG. 1 except that the burner shell 414 has disposed within it a liquid tank 360 which is secured to the burner shell by a plurality of holders 365. A liquid inlet tube 374 pierces the burner shell and connects to the liquid tank 360. Liquid is supplied to the liquid supply tube 374 from an inner liquid shell 320. The inner liquid shell 320 is encased by an outer liquid shell 340. Liquid is supplied to the outer liquid shell 340 through a cold liquid inlet tube 322 which supplies cold liquid to a bottom portion of the outer liquid shell 340 as well as supplying some cold liquid through a weep hole 372 in the inner liquid shell to the space between the inner liquid shell and 320 and the burner shell 414. Partially warm liquid is communicated from the outer liquid shell 340 to the inner liquid shell 320 and a liquid inlet port 326 disposed on an upper side surface of the inner liquid shell 320. The exhaust from the exhaust tube 450 is ducted through an exhaust conduit 330 which is coiled around the inner liquid shell 320 to heat the inner liquid shell as well as the liquid in the outer liquid shell 340.

In the operation of the second embodiment of the building heating device, the circulating pump 280 is started to begin circulation of water through the cold liquid inlet pipe 322 and the hot liquid outlet pipe 354. Thereupon pressurized combustible mixture is admitted to the combustible mixture supply line 440 and combustion is started as discussed above. A portion of the heat generated by the burning is communicated to the burner shell 414.

The cold water flowing through the cold liquid inlet 322 flows into the outer liquid shell 340 and a portion flows through the small weep holes 372 and into the inner liquid shell 320 which surrounds the burner shell 414. The majority of the cold water flows into the outer liquid shell 340 with a small quantity flowing directly into the inner liquid shell 320 to equalize pressures. The cold liquid which flows into the outer liquid shell 340 then flows upwardly around the exhaust conduit at 330 and inwardly through the two weep holes 328 and the liquid inlet port 326 into the inner liquid shell 320. The two weep holes 328 atop the inner liquid shell 320 are preferably twice the size of the small weep hole 372 at the bottom of the inner liquid shell 320. The liquid entering through the small weep hole 372 at the bottom of the inner liquid jacket 320 moves upwardly and around the combustion chamber 414 meeting with the liquid from the outer liquid jacket as it comes through the weep holes 328 and the inlet port 326. The inlet port 326 is preferably three times the size of the weep holes 328 disposed at the top of the inner liquid shell 320. These liquids merge and are further heated in the inner liquid shell 320 and eventually enter a liquid supply tube 374 which supplies liquid to the liquid tank 360. The liquid enters through a side of the liquid tank 360 and flows downwardly towards a bottom of the tank 360 and upward through a hot liquid outlet pipe 376 in the center of the liquid tank 360. The tank 360 and the outlet pipe 376 act to further heat the liquid by communicating the liquid, immediately before it is exhausted from the device 400, with the hottest combustion products in the burner 410. The hot liquid flowing from the hot liquid outlet pipe 376 picks up further heat from the hot combustion product flowing through the exhaust pipe 450 which surrounds a portion of the hot liquid outlet pipe 376. The hot liquid outlet pipe 376 connects to the hot liquid exhaust tube 354 which in turn delivers the hot liquid via the hot liquid conduit 260 to the radiator 270 as described above.

Preliminary testing done on the building heating apparatus shows an exhaust gas temperature of only approximately about 37° C. can be readily obtained with no noticeable fumes. The liquid is heated by the building heating apparatus to approximately 65° C. in approximately one minute with enough heat generated to adequately service a 130 square meter building. In size, this preferred embodiment of the building heating apparatus is under 60 cm in height and is about 12 cm in diameter. Of course, the apparatus may be made larger or smaller as the size of the enclosure or building to be heated warrants.

It should also be noted that the heating apparatus of the present invention may be used to heat large boats, railway carriages and the like.

With reference now to FIG. 11, another more preferred embodiment of an enclosure or building heating device according to the present invention includes the pulsing combustion device 510 (or HASER burner) generally as described in connection with FIG. 1 but with some modifications. An elongate, cylindrical combustion chamber shell or burner shell 514 defines a combustion chamber 515 with the combustion chamber shell 514 generally tubular with a length that is considerably greater than its width. An end cap 576 is disposed at an inlet end of the combustor shell 514 with the end cap 576 together with the combustor shell 514 defining a path of reciprocation in the space 517 for the poppet valve 520. After combustion, the combustion gases exit through an exhaust tube 550 disposed at an exhaust end 518 of the combustor shell 514. The combustion chamber 515 is closed except for the outlet for combustion gases and the inlet for admitting the combustible mixture.

The combustible mixture is formed in a mixing chamber means 505 which is supplied with air through conduit 508 and gas through conduit 509. The combustible mixture is then supplied to a pumping mechanism 506 which pressurizes the combustible mixture. Since the mixture is, of course, highly flammable, the pumping mechanism 506 must be appropriately protected against electrical discharges and other disturbances which might ignite the mixture.

Preferably, the pumping mechanism 506 discharges the combustible mixture as a series of discrete pulses at a desirable rate. A typical rate of discharge is about 3000 pulses per minute. An automobile emission system pollution control pump ("smog" pump) has been successfully utilized experimentally to pressurize the combustible mixture in discrete pulses. Such a pump generally has two vanes and rotates at 1500 rpm.

The pulsed supply of the combustible mixture is then passed through a suitable, conventional check valve 507 and then immediately into a supply line 540. The distance between the pumping mechanism 506 and the pulsing combustion device 510 is appropriately short and is preferably not provided with baffles or large chambers so as to maintain the "pulsed" nature of the supply to the extent possible.

In other words, the supply line 540 is arranged so as to convey the combustible mixture to the poppet valve 520 as a series of discrete pulses to the extent readily possible.

The combustible mixture is supplied by the line 540 through a passageway 534 to the lower surface of the reciprocating poppet valve 520. The passageway 534 communicates with a chamber 532 having a spring 530 which assists in the upward movement of the poppet valve 520.

The inner face of the end cap 576 includes an annular channel which communicates with the chamber 532 by way of four radial slots 517. The radial slots 517 are arranged in the shape of a cross with the remainder of the inner face of the end cap 576 forming a valve seat for a bottom surface 521 of the poppet valve. The outer periphery of the surface 521 sealingly abuts the inner surface of the end cap when the poppet valve is in its rearwardmost position.

A flange is secured (for example, by welding), to the end cap 576 to facilitate the assembly of the end cap 576 with the shell 514. A plurality of bolts 574 extend through openings in the flange and are threadably received by corresponding nuts 572 which are secured (as by welding) to the shell 514. A sealing gasket (not shown), preferably of neoprene or another gasket material suitable for high temperature use may be preferably disposed between the end cap 576 and the lower end wall of the burner shell 514.

The end cap preferably has four holes for receiving the bolts 574. In this way, two of the bolts may be used to join the end cap and the burner shell together and the remaining two bolts may be used to mount the combustion device in the furnace or other location of operation. As discussed more fully below, the combustion device according to the present invention need not be arranged vertically, but instead can be mounted horizontally or inverted or in any suitable configuration.

The poppet valve 520 disposed for reciprocal movement in the burner or combustor shell 514 is generally mushroom-shaped with an open interior or bore 526 (see also FIG. 13). The poppet valve 520 is preferably of integral construction and includes a base having a first diameter and a tube 523 having a reduced diameter with the bore extending through the tube and through a portion of the base. A small clearance is provided between a side wall of the base of the poppet valve and a side wall 519 of the end cap 576 to allow the free reciprocal movement of the poppet valve.

The poppet valve 520 is disposed beneath the combustor shell 514 for reciprocation as in the embodiment of FIG. 1. A plurality of ports 524, preferably sixteen in number, is disposed about the poppet valve 520 beneath the shoulder 522 of the poppet valve 520 and provides communication between the bore of the poppet valve and the small clearance between the side wall of the poppet valve and the side wall 519. Preferably, the poppet valve is recessed immediately beneath the outer end of the ports 524 around the entire periphery of the poppet valve. In this way, communication with the ports is more easily obtained.

A diffuser ring 529 extends upwardly from the base of the poppet valve to define a cup 528. The diffuser ring 529 is generally shaped as an inverted "L" in cross section (see FIG. 13) and defines an annular chamber which forms an extension of the ports 524. The annular chamber directs the combustible mixture upwardly along the inner wall 526 of the poppet valve to assist in the rapid ignition of the heating device.

The use of the diffuser ring 529 has resulted in a nearly instantaneous ignition (upon firing of the spark plug 560) and is believed to result in an increased thermal efficiency for the device.

The poppet valve includes an annular wall 523 which extends along the burner shell 514. The annular wall 523 preferably fits smoothly within the burner shell 514 so as to securely guide the poppet valve during its reciprocal movement without binding or otherwise inhibiting the free movement of the poppet 520.

Care must be taken that the annular wall 523 is not too loose to permit the poppet 520 to become "cocked" in the burner shell 514. Likewise, the annular wall must not be so tight as to inhibit or restrict movement of the poppet. In this regard, the thermal expansion of the poppet and the burner shell must be taken into consideration when selecting the various materials of construction and when sizing the components.

As in the embodiment of FIG. 1, a spark plug 560 extends into the combustion chamber through a threaded bore in the combustor chamber shell 514 and is provided to initially ignite the combustion gases in the shell 514.

The check valve 507 is provided in the line 540 to prevent backfire through the supply line 540 by preventing a flame in the combustion chamber 515 from spreading backwardly into the combustible mixture supply line 540. If desired, additional or different backfire prevention devices could be provided.

The exhaust tube 550 at the exhaust end 518 of the burner shell 514 has a first end 551 disposed at the exhaust end surface 512 of the burner shell 514 and a second end 552 disposed outside the burner shell 514. The exhaust tube 550 is relatively small in cross-sectional diameter with respect to the burner shell 514.

The outer surface of the burner shell 514 is preferably provided with a plurality of suitable, conventional vanes which facilitate a heat exchange with the surrounding air. In addition, the exhaust pipe 550 communicates with an inner heat exchange coil and an outer heat exchange coil by way of a T-fitting 552. The inner and outer heat exchange coils each encircle the burner shell 514 to provide an efficient and compact configuration and so as to effectively transfer heat to the surrounding air. The inner and outer heat exchange coils are themselves conventional and preferably include heat exchange vanes (not shown) on an outer surface of the coils to facilitate a transfer of heat to the surrounding air. The heat exchange vanes may be of aluminum or copper or any other suitable material which readily conducts heat.

The exhaust gases from the inner and outer coils may then be recombined and are supplied to a suitable, conventional exhaust.

The pulsing combustion device 510 of FIG. 11 is preferably provided in a gas heat exchange configuration such as a conventional forced air furnace housing (not shown). The pulsing combustion device 510 may be mounted for updraft, downdraft or crossdraft air flow with the air to be heated being flowed over the coils and over the burner shell 514. In this w the air to be heated cools the burner shell to prevent overheating.

The air to be heated is preferably driven over the coils and the burner shell by a suitable, conventional blower (not shown) with the pulsing combustion device being mounted in a closed housing (not shown) to direct the forced air over the coils and the burner shell.

During operation, a pressurized combustible mixture is supplied to the poppet valve through the combustible mixture supply line 540. The combustible mixture is preferably an air and gas combination with the gas preferably being either natural gas or propane although pure ethane, pure methane or other combustible gases would also suffice. Gas and air are mixed through a suitable, conventional valving system mixing means 505 to form the combustible mixture which is supplied to a suitable, conventional pulsed compressor mechanism 506 (such as a vane pump) to supply the combustible mixture in the supply line 540 as a series of pressure pulses.

The combustible mixture is preferably supplied in the supply line 540 as a stream of pressure pulses corresponding to the desired rate of reciprocation of the poppet valve 540. For example, if the poppet valve preferably oscillates at a rate of about 800 times per minute, the compressor mechanism would preferably supply pulses of the combustible mixture at the same rate of about 800 per minute.

In the home heating embodiments of the present invention a relatively low average pressure of up to about 0.15 kg/cm$^2$ (or 2 p.s.i.) is considered to be desirable. Using such relatively low pressure mixtures, the pulsed nature of the supply of the combustible mixture contributes significantly to the reciprocal movement of the poppet valve 520. In the steam gun, however, the preferred pressure for the combustible mixture is about 4.2 kg/cm$^2$ (or 60 p.s.i.) when an air compressor is used or about 0.40 kg/cm$^2$ (or 5 p.s.i.) if the combustible mixture is supplied in a pulsed configuration.

In other words, at relatively low supply pressures (as are believed to be desirable in home heating embodiments of the present invention) the combustible mixture is preferably supplied as a series of generally discrete pulses at a rate corresponding to the desired rate of oscillation of the poppet valve.

The combustible mixture flow initially lifts the poppet valve 520 (with the assistance of the spring 530, if provided) so that the combustible mixture can flow into the small clearance between the poppet valve outer side wall and the inner side wall 519 of the end cap 576. The combustible mixture may then flow through the ports 524 into the combustion chamber by way of the bore 526 of the poppet valve. The combustible mixture also pushes against the rear surface 521 of the poppet valve 520 and thereby lifts the poppet valve 520 away from the end cap 576 of the burner shell 514. With continued pressure against the rear surface 521, the shoulder 522 of the poppet valve 520 contacts and seats against the shoulder 516 of the burner shell 514.

The combustible mixture flows through the ports 524 in the poppet valve 520, up along the wall 523 and into the open interior 526 thereof. Note that because the shoulder 522 of the poppet valve 520 is in a sealing contact with the shoulder 516 of the shell 514, the combustible mixture is constrained to flow through the ports 524 in the poppet valve 520. The combustible mixture then flows out a front bore 526 in the poppet valve 520 and flows into a main portion of the burner shell 514.

After the combustible mixture has first entered the combustion chamber 515, the spark plug 560 is fired once to initially ignite the mixture. Once the spark plug 560 has initially ignited the combustible mixture the spark plug 560 is no longer utilized. Instead, further ignition of the combustion mixture occurs due to the heat still retained in the combustion chamber 515. When a new charge of combustible mixture is admitted into the combustion chamber 515, the hot products of combustion in combination with the pressure and/or shock waves (due to the high velocity flows) ignite the fresh combination mixture. Thus the combustion, charging and ignition process repeats itself automatically and continuously.

Combustion thereupon takes place and the explosion of the combustible mixture increases the pressure within the combustion chamber and thereby forces the poppet valve 520 to seat itself against the rear inner surface of the end cap 576.

As the burned combustible mixture is exhausted from the combustion chamber 515 through the exhaust tube 550, the pressure in the combustion chamber 515 decreases. When the pressure in the combustion chamber 515 has decreased sufficiently (for example, to an effective pressure below the effective pressure of the combustible mixture in the combustible mixture supply line 540), the pressure of the combustible mixture forces the poppet valve 520 upwardly from the cap 517 of the burner shell 514 to repeat the process. With the pressurized mixture pushing against the rear surface 521 of the poppet valve 520 and the hot exhaust products pushing on an inside rear surface 528 of the poppet valve 520, the poppet valve acts somewhat like a differential piston. When the poppet valve is in its lowermost position, the area on which the combustible mixture pressure acts, (the area of the annular channel and radial slots 517), is significantly less than the area on which the exhaust products pressure acts, (the cross sectional area of the poppet valve 520). In relatively low supply pressure situations, the spring 530 assists the pressure of the combustible mixture to counteract the pressure of the exhaust gases. Thus a lower pressure (than the pressure in the combustible mixture supply line 540 and the spring pressure) is generally required in the combustion chamber 515 before the poppet valve 520 is lifted from engagement with the end cap 517 of the burner shell 514.

Thus the use of a relatively low pressure (such as is typical in home heating equipment) supply of the combustible mixture (especially in the form of discrete pulses) can be effectively utilized in the combustion device according to the present invention.

In the relatively high pressure embodiments, the relatively small effective surface area of the poppet valve (in the lowermost position) is utilized to balance the pressure of the exhaust gases to result in the reciprocal movement of the poppet. At a relatively small supply pressure, the effective area of the poppet valve (in the lowermost position) is preferably increased as by the annular channel and radial slots. Furthermore, the annular channel and radial slots also facilitate the supply of the combustible mixture to the ports 524 at the reduced supply pressure and when the physical dimensions of the poppet are substantially increased.

In the relatively low supply pressure embodiment, the use of a pulsed combustible mixture further facilitates the smooth operation of the device by assisting in the regulation of the reciprocal movement of the poppet. Still further, the use of an appropriately sized spring can counterbalance the weight of the poppet to permit operation of even a relatively large burner device with a relatively low supply pressure.

The use of a pulsed supply mixture is also believed to facilitate the smooth reciprocal movement of the poppet valve by providing a "dither" action in which the maximum pressure of each pulse provides an increased force on the effective area of the poppet valve. In this way, if the rate of the pulses corresponds to the reciprocation rate of the poppet valve, the pulses can effectively overcome the somewhat higher resistance to "unseating" of the poppet valve from the end cap. Once the poppet valve has "unseated" the significant increase in effective area for the poppet valve facilitates the further movement of the poppet valve until it becomes seated against the burner shell (at its uppermost limit of travel).

During experimental operation of various models of the present invention, noise levels of only about 60 decibels at a distance of about two feet or 0.6 meter were observed. Condensation formed in the exhaust was only slightly acidic and the device could readily be adjusted so as to provide no unburned hydrocarbons in the exhaust.

The principles, preferred embodiments and modes of operation of the present invention have been described in the foregoing specification. The invention which is intended to be protected herein should not be construed as limited to the particular forms disclosed, since these are to be regarded as illustrative rather than restrictive. Variations and changes may be made by those skilled in the art without departing from the spirit of the present invention.

What is claimed is:

1. A pulsing combustion device comprising:
    means for defining an elongate combustion chamber having an inlet for a combustible mixture and an unvalved outlet for combustion gases;
    a floating poppet valve member mounted in reciprocation relation in a wall of said combustion chamber, said poppet valve member having a first side in communication with said combustion chamber and a second side in communication with a supply of a combustible mixture and having at least one port through said valve member, said reciprocation of said poppet valve member in said wall closing and opening communication through said at least one port between said combustion chamber and said supply of combustible mixture, said floating poppet valve member having means for directing said combustible mixture along the sides of said combustion chamber;
    means for supplying a pressurized combustible mixture to said second side of said poppet valve member, said supply means having substantially smaller cross section area than said second side of said poppet valve member;
    means for combusting said combustible mixture in said combustion chamber to produce pressurized combustion gases, said poppet valve member being reciprocated by said pressurized combustible mixture in communication with said second side and said pressurized combustion gases in communication with said first side to regulate the flow of said combustible mixture into said combustion chamber.

2. The device of claim 1 wherein said at least one port is located through the periphery of said poppet valve member.

3. The device of claim 1 wherein said poppet valve member has a periphery which reciprocates within a limiting chamber.

4. The device of claim 1 wherein said unvalved outlet has a cross section relatively small with respect to a cross section of said combustion chamber.

5. The device of claim 1 wherein said means for combusting said combustible mixture includes a spark plug extending into said combustion chamber, saidspark plug initially igniting said combustible mixture.

6. The device of claim 1 wherein said means for supplying a pressurized combustible mixture comprises means for supplying said mixture as a series of discrete pressure pulses.

7. The device of claim 1 wherein said means for supplying a pressurized combustible mixture comprises a check valve.

8. The device of claim 1 wherein said means for supplying a pressurized combustible mixture comprises a gas supply conduit, an air supply conduit, a mixing chamber, said gas supply conduit and said air supply conduit supplying gas and air, respectively, to said mixing chamber, and said mixing chamber having an outlet conduit in communication with said second side of said poppet valve member.

9. The device of claim 1 comprising a spring urging against said second side of said poppet valve.

10. A pulsing combustion device comprising:
    means for defining a combustion chamber having an inlet for a combustible mixture and an unvalved outlet for combustion gases;
    a floating poppet valve member mounted in reciprocation relation in a wall of said combustion chamber, said poppet valve member having a first side in communication with said combustion chamber and a second side in communication with said inlet for a combustible mixture and having at least one port in through said valve member first and second sides, said poppet valve member being cup-shaped having a base portion and a reduced diameter cylindrical portion and wherein the reduced diameter cylindrical portion of said poppet valve member has a hollow interior in communication with the combustion chamber, said reciprocation of said poppet valve member in said wall closing and opening communication through said at least one port between said combustion chamber and said inlet for combustible mixture, said floating poppet valve member having means for directing said combustible mixture along the sides of said combustion chamber;
    means for supplying a pressurized combustible mixture to said second side of said poppet valve member, said supply means having substantially smaller cross section area than said second side of said poppet valve member;
    means for combusting said combustible mixture in said combustion chamber to produce pressurized combustion gases, said poppet valve member being reciprocated by said pressurized combustible mixture in communication with said second side and said pressurized combustion gases in communication with said first side to regulate the flow of said combustible mixture into said combustion chamber.

11. The device of claim 10 wherein said poppet valve member has a periphery which reciprocates within a limiting chamber.

12. A pulsing combustion device comprising:
    means for defining an elongate combustion chamber having an inlet for a combustible mixture and an unvalved outlet for combustion gases;
    a floating poppet valve member mounted in reciprocation relation in a wall of said combustion chamber, said poppet valve member having a first side in communication with said combustion chamber and a second side in communication with a supply of a combustible mixture and having at least one port through said valve member, said reciprocation of said poppet valve member in said wall closing and opening communication through said at least one port between said combustion chamber and said supply of combustible mixture, said floating poppet valve member having means for directing said combustible mixture along the sides of said combustion chamber;
    means for supplying a pressurized combustible mixture to said second side of said poppet valve member, said supply means having substantially smaller cross section area than said second side of said poppet valve member and comprises a combustible mixture supply line, a ball valve chamber defined between an end of said combustible mixture supply line and said poppet valve member, and a ball disposed for reciprocating movement in said ball valve chamber;
    means for combusting said combustible mixture in said combustion chamber to produce pressurized combustion gases, said poppet valve member being reciprocated by said pressurized combustible mixture in communication with said second side and said pressurized combustion gases in communication with said first side to regulate the flow of said combustible mixture into said combustion chamber.

13. The device of claim 12 wherein the ball valve chamber further comprises:
    a ball valve seat for sealingly seating the ball at a rear portion of said ball valve chamber.

14. A pulsing combustion device comprising:
    a burner shell defining a combustion chamber and having a restricted inlet and an unvalved restricted outlet;
    ball check valve means in said restricted inlet for preventing back flow at said restricted inlet end of said burner shell;
    combustible mixture supply line means for supplying a pressurized combustible mixture to said restricted inlet by way of said ball check valve means;
    means for igniting said combustible mixture within said combustion chamber to produce pressurized combustion gases; and
    a floating poppet valve member reciprocably disposed in a wall of said combustion chamber, said poppet valve member being cup-shaped having a hollow interior in communication with said combustion chamber and an opposite side in communication with said restricted inlet and having at least one port through the periphery of said poppet valve member for admitting said combustible mixture from said inlet into said combustion chamber, said floating poppet valve member having means for directing said combustible mixture along the sides of said combustion chamber said poppet valve member being reciprocated in said wall by said pressurized combustible mixture and by said pressurized combustion gases to open and close communication through said at least one port between said inlet and said combustion chamber.

15. The device of claim 14 wherein said restricted outlet is defined by an exhaust tube of relatively small cross section relative to the burner shell.

16. A method for combusting a combustible mixture, comprising the steps of:
    (a) supplying a pressurized combustible mixture to a first end of a floating poppet valve member, said poppet valve member being at a first location;
    (b) moving said poppet valve member in a first direction by said pressurized combustible mixture to a second location thereby opening communication between said combustible mixture supply and a combustion chamber through at least one port through said floating valve member;
    (c) admitting said combustible mixture through said at least one port and directing said combustible mixture along the sides of a combustion chamber when said poppet valve member is in said second location;
(d) combusting said combustible mixture in said combustion chamber to produce combustion gases;
(e) moving said poppet valve member in a second direction, opposite to said first direction, by the pressure of said combustion gases to return said poppet valve member to said first location thereby closing communication through said at least one port between said combustion chamber and said combustible mixture supply;

(f) interrupting said admission of said combustible mixture to said combustion chamber when said poppet valve is in said second location;
(g) venting a portion of said combustion gases through an unvalved vent to reduce the pressure of the combustion gases in the combustion chamber;
(h) sequentially repeating said steps b through step g.

17. The process of claim 16 wherein said poppet valve is kept in motion by the pressure of said combustion gases and said combustible mixture supply.

* * * * *